United States Patent [19]
Stevens et al.

[11] Patent Number: 5,910,706
[45] Date of Patent: *Jun. 8, 1999

[54] LATERALLY TRANSMITTING THIN FILM ELECTROLUMINESCENT DEVICE

[75] Inventors: Robert Stevens, Sherwood; Wayne Mark Cranton, Tollerton Notts; Clive Barrington Thomas, Burton Joyce, all of United Kingdom

[73] Assignee: Ultra Silicon Technology (UK) Limited, United Kingdom

[ * ] Notice: This patent issued on a continued prosecution application filed under 37 CFR 1.53(d), and is subject to the twenty year patent term provisions of 35 U.S.C. 154(a)(2).

[21] Appl. No.: 08/781,942

[22] Filed: Dec. 18, 1996

[51] Int. Cl.$^6$ .................................................. H05B 33/00
[52] U.S. Cl. ..................... 313/498; 313/112; 313/113; 313/114; 313/506
[58] Field of Search ..................... 313/497–498, 313/509, 113, 112, 110, 506, 114, 116

[56] References Cited

U.S. PATENT DOCUMENTS

| | | | |
|---|---|---|---|
| 4,394,601 | 7/1983 | Takeda et al. | 313/509 |
| 4,535,341 | 8/1985 | Kun et al. | 313/509 X |
| 4,734,723 | 3/1988 | Ishitobi | 346/160 |
| 4,774,334 | 9/1988 | Bennion | 313/500 |
| 4,774,435 | 9/1988 | Levinson | 313/509 |
| 4,885,448 | 12/1989 | Kasner et al. | 219/121 |
| 5,072,152 | 12/1991 | Tuenge et al. | 313/509 |
| 5,124,543 | 6/1992 | Kawashima | 250/208.1 |
| 5,131,065 | 7/1992 | Briggs et al. | 313/497 X |
| 5,142,192 | 8/1992 | Takahashi et al. | 313/506 |
| 5,436,279 | 7/1995 | Grundke et al. | 522/14 |

FOREIGN PATENT DOCUMENTS

| | | |
|---|---|---|
| 0 365 445 A2 | 10/1989 | European Pat. Off. . |
| 0 365 445 A3 | 10/1989 | European Pat. Off. . |
| 0 420 167 A2 | 9/1990 | European Pat. Off. . |
| 2 046 012 | 10/1979 | United Kingdom . |
| 2 122 810 | 6/1983 | United Kingdom . |
| 2 152 751 | 11/1984 | United Kingdom . |
| 2 271 022 | 9/1993 | United Kingdom . |
| 2 278 853 | 5/1994 | United Kingdom . |

*Primary Examiner*—Nimeshkumar D. Patel
*Attorney, Agent, or Firm*—Sheridan Ross P.C.

[57] ABSTRACT

A multi-purpose light source comprising a laterally transmitting TFEL device (1,2a,2b,4) with a means to de-couple the intense lateral transmission via reflecting microstructures (11) is formed onto substrates in which, in the preferred embodiment, there is pre-fabricated addressing/drive circuitry (36 through 42). Such light sources are applicable to displays, particularly small area high resolution displays, and to linear imaging arrays, such as in electrophotographic printers.

20 Claims, 12 Drawing Sheets

| X | Y | TFEL STATE |
|---|---|---|
| 1 | 1 | TURN ON |
| 1 | 0 | TURN OFF |
| 0 | 1 | NO CHANGE |
| 0 | 0 | NO CHANGE |

LATERALLY TRANSMITTING THIN FILM ELECTROLUMINESCENT DEVICE

THE RELATED FIELD OF INVENTION

The present invention relates to a laterally transmitting thin film electroluminescent device, for use as a multi-purpose light source for display and electrographic printing applications.

BACKGROUND OF THE INVENTION

Thin film electroluminescent (TFEL) devices are utilised primarily to provide the light source for flat panel emissive displays, see, for example reference (1) and references therein. A typical TFEL display structure is shown in schematic cross-section in FIG. 1, where a light emitting phosphor thin film is sandwiched between dielectric cladding layers to form a capacitative structure. Electrodes are disposed on the outer surfaces of the cladding dielectrics, such that the application of a high voltage ac signal between these electrodes results in the emission of light form the phosphor thin film, due to the high electric field strength in the phosphor film being greater than a threshold value. For typical display applications, the thin films are deposited onto a transparent substrate, wish one of the electrode layers also being transparent, such at light generated within the phosphor layer may be viewed directly. This is termed surface emission.

A significant disadvantage associated with conventional surface emission is the fact that up to 90% of the light generated by thin film phosphors is tripped within the phosphor layer by virtue of internal reflection, and is transmitted laterally, as shown in FIG. 2. This occurs because phosphor thin films generally have a refractive index that is higher than that of the materials used to clad them. This effect was first reported by D H Smith in 1982, J Lum 23 (1983) 209 when he observed that the light intensity emitted at the edge of a TFEL thin film display was much greater than that emitted directly though the surface. Recognising this as a loss mechanism, several groups have attempted to improve the luminous surface emission by reducing the internal reflection, so as to allow more light to be emitted directly through the thin film surface. Described, for example in U.S. Pat. No. 5,131,065 (Boeing) is a method of improving the surface emission from TFEL panels by index matching the optical properties of the phosphor and dielectric layers, such that internal reflection is minimised. Alternatively, U.S. Pat. No. 5,072,152 (Planar Systems), and U.S. Pat. No. 4,774,435 (GTE Labs) both teach the use of rough non-planar interfaces between the phosphor thin film and the cladding layers. The Planar Method is to initially deposit a dielectric layer onto a planar substrate, where the dielectric is deposited by electron-beam evaporation in order to generate a rough surface contour. This "convoluted" surface contour is then replicated by the thin films deposited on top, such that the internal light reflection is reduced and more light output is provided at the front of the panel. The GTE method is to produce the same effect—a rough, non-planar surface at the phosphor/dielectric interface, but in this case it is achieved by depositing the thin films onto a substrate that has a rough non-planar surface. In each case, the technique used is intended to overcome the inherent internal reflection by increasing the probability that the angle of incidence for a light ray arriving at the phosphor/dielectric interface will be less that the critical angle and will thus be transmitted.

The methods described above, if successfully implemented, will undoubtedly improve the direct surface emission through the various thin films. However, in doing so they effectively eradicate a property of TFEL devices that may in fact be highly beneficial; i.e. the confinement of up to 90% of the generated light to within the geometrical limits of the phosphor thin film. Since such phosphor thin films are in general of the order of 1 micron thick ($10^{-6}$ m), the result is the concentration of the light energy to a microscopic area. This consequently increases the intensity relative to that of conventional surface emission, where approximately 10% of the light energy is spread over an area of typically 100 $micron^2$.

The gain in emitted light intensity (luminance) that may be attained via the utilisation of laterally transmitted light was demonstrated by D H Smith in 1982, J Lum 23 (1983) 209 when he observed that the luminous efficiency of a TFEL display could be increased by including the light that was unintentionally emitted from the edge of the thin film stack. This concept was then further developed by workers from Westinghouse Corp and Edge Emission Incorporated into methods of producing high intensity light sources for image bar arrays intended to work in electrophotographic printers. Described in US and European patents: U.S. Pat. No. 4,535,341, U.S. Pat. No. 4,685,448 and EP 0 398 591 A2 are devices where the light is emitted in a direction parallel to the substrate, directly from an exposed edge of the phosphor film. This is similar, in principle, to the structure of an edge emitting LED, or diode laser, where spatially confined light is channelled to an emitting facet, which is typically formed by cleaving the substrate as described by J. Wilson, and J. F. B. Hawkes; in *OptoElectronics An Introduction*, Prentice Hall International, (1983) 211. However, as detailed in U.S. Pat. No. 4,535,341, the TFEL edge emitting linear arrays are formed by defining an exposed emitting facet in the TFEL stack directly at the edge of the substrate. In such a configuration, the proximity of both the emitting facet, and the electrodes to the substrate edge is problematic due to the high voltages required to operate TFEL devices and due to the sensitivity of the EL materials to the effects of exposure to moisture and other contaminants. Attempts to overcome these problems are consequently concerned with protection of the emitting edge, and the isolation of the electrodes across which the high voltage drive signal is applied. For example, in U.S. Pat. No. 4,734,723, an optical printer head is disclosed that is formed from a plurality of edge emitting TFEL devices positioned along one edge of the substrate, with waveguide strips to transmit the light from the EL device to the other end of the substrate, similar to the operation of an edge emitting LED. While protecting the TFEL edge emitter, this presents additional optical attenuation, and may thus reduce the benefits of edge emission in regard to the intensity of light produced. Alternatively, as disclosed in EP 0 398 591 A2, a practical edge emitter light source requires an integral housing, or packaging assembly to protect the device. Such an assembly is described, which consists of a series of spacers and packaging members arranged around the TFEL substrate and sealed to prevent contamination. Again, the extra optical interfaces that result from such packaging may be detrimental to the emitted light intensity, and the packaging process itself, requiring precision mechanical alignment, is costly and difficult.

SUMMARY OF THE INVENTION

Therefore, as a significant improvement over the prior art described above, one aspect of the present invention makes use of the high intensity light emission that is possible when utilising the laterally transmitted, internally reflected light of a TFEL device, but in a manner that does not require the formation of emitting facets at the edge of the substrate, thus eradicating the problems associated with such a configuration.

According to a first aspect of the present invention there is provided a thin film electroluminescent (TFEL) device including an active phosphor layer sandwiched between dielectric layers with electrodes formed an the outer surfaces of the dielectric layers which provide the means to apply an AC drive signal to generate light within the phosphor thin-film via the process of electroluminescence. The inherent internal reflection of the thin-film structure is used to provide lateral transmission of the generated light. The present invention relates to the product of high-intensity illuminous emission via the effective decoupling of this laterally transmitted light away from the substrate plane. This is achieved, via the inclusion of reflecting microstructures (micro-mirrors) within, or adjacent to the laterally transmitting TFEL device. Such reflecting micro-structures thus provide the decoupling means and may be fabricated in or onto the substrate, such that following the deposition and fabrication of the TFEL device(s), light transmitted laterally within the TFEL device(s) will encounter a decoupling means (reflecting micro-structures) and will be decoupled from the substrate plane. Examples of how such a decoupling means may be included on a substrate with TFEL devices are shown in FIGS. 3–8.

In the preferred embodiment of the invention, photolithographic techniques are used to define emitting regions in the TFEL devices with de-coupling means in the form of reflecting micro-structures formed onto or into the substrate so as to effectively de-couple the intense laterally transmitted light in a direction away from the substrate plane.

In order to further enhance the optical de-coupling, cladding/outcoupling layers are deposited in/over the emitting regions, and these additional layers also serve to protect the device. Fabrication of the TFEL device, reflecting microstructure, and cladding/outcoupling layer may be achieved using standard microelectronic device processing techniques, resulting in a protected and hermetically sealed high intensity light source. Furthermore, since the invention does not require the formation of an array of emitting facets at the edge of a substrate, the geometrical configuration of light sources is defined photolithographically. Those skilled in the art of microelectronic device fabrication will consequently recognise that the invention permits the flexibility to define a multi-purpose high intensity, high resolution light source satisfying the requirements for both display and printing applications. For example, the combination of TFEL devices and reflecting micro-structures may be arranged so as to form the matrix of emitting regions necessary for a video graphics display, or in fixed shape; for fixed legend displays, or in linear arrays for printing applications. Considering the latter example, it is a further benefit of the invention that a linear array of light sources so formed may consist of reflecting micro-structures with two mutually inclined reflecting surfaces so as to combine the laterally transmitted light from two opposing TFEL emitting facets into one light source. This clearly enhances the light energy emitted relative to that obtained from one light source.

A further development of the invention is based on the fact that the use of laterally transmitted light combined with reflecting microstructure(s) and cladding/outcoupling layer (s) does not require a transparent substrate. Indeed, the use of microelectronic device fabrication processes implies that the preferred substrate would be one which is compatible with such fabrication, e.g. a silicson wafer. As such, it will be obvious to those skilled in the art, that the present invention facilitates the combination of the high intensity, high resolution, multi-purpose light source with integrated drive and/or addressing circuitry that is pre-fabricated into the, for example, silicon substrate. This further permits the use of high frequency drive signals which will enhance the emitted light intensity. The benefits of using such active matrix addressing for increasing the luminance of conventional surface emitting TFEL devices is well known. Vanterleteren et al in the Conference Record of the 1991 International Display, 134 Conference, for example, demonstrated an active matrix circuit where surface emitting TFEL devices are addressed via high voltage (200 volt) thin film transistors (TFT's), and light is emitted through a transparent electrode. However, as described in U.S. Pat. No. 5,436,279, such a TFT based circuit precludes the production of a high resolution display due to the channel dimensions of a TFT, and the need for high voltage capacitors to be included in the circuit. Proposed in U.S. Pat No. 5,463,279, therefore is an alternative configuration for an active matrix surface emitting TFEL device, where circuit elements are disposed on the substrate, such that the dimensions are reduced, and the gating device operates in its breakdown region to avoid the use of a high voltage capacitor. Again, in this active matrix device, the light is emitted through a transparent upper electrode. Hence, while these configurations both provide a means to fabricate active matrix EL pixels, they both rely upon the surface emission of light through transparent electrodes. Much light energy is thus wasted due to the internal reflection effect, and the realisation of both high resolution and high intensity is thus precluded. This is illustrated by the published luminance values obtained from devices fabricated according to U.S. Pat. No. 5,463,279, where displays intended primarily for head mounted applications are presented having luminances of the order of 100 fL as reported by C. King; proceedings of the EL 96 Berlin (1996) 375. Unfortunately, this level of luminance is only acceptable for a limited range of applications, where background lighting is dim, or where the display is shrouded in a closed ocular enclosure. A universally applicable display technology would have sufficient luminance to be used in an open-ocular system, (i.e. where the display is superimposed on the users normal field of view) and would provide the necessary contrast against the background illumination. This requires luminances of the order of 3000–5000 fL, which is clearly not produced by the conventional surface emission TFEL de ices. The present invention therefore describes a device structure that by combining the reflection of laterally transmitted light with the benefit of integrated drive circuitry, is a major improvement over the prior art. Furthermore, since the light from active matrix EL devices described previously is emitted only through the transparent electrode, religions of the pixel which are not generating light, such as active circuit elements, contribute to wasted area. This is contention of U.S. Pat. No. 5,463,279 against Vanterleteren et al, since the circuit described by the latter requires a high voltage Capacitor which takes up valuable space. A significant improvement over both of these designs is therefore facilitated by the present invention, since the reflecting microstructures are passive regions, and may thus be fabricated over active circuit elements with no detrimental effect. In this way, valuable pixel area is efficiently utilised.

The present invention therefore provides significant improvements over the prior art in that by combining reflecting micro-structures with laterally emitting TFEL devices, and using micro-electronic fabrication techniques to form, in combination, cladding/outcoupling layers and/or integrated drive/addressing circuitry, a general purpose high intensity, high resolution light source is provided.

DETAILED DESCRIPTION OF THE PREFERRED EMBODIMENTS

As previously described, up to 90% of the light generated by a TFEL phosphor thin film can be trapped within it due to internal reflection, as illustrated by FIG. 2. Furthermore, since the thickness of a phosphor thin film is of the order of 1 micrometre, the result is that laterally transmitted (internally reflected) light can provide a high intensity light source, provided that (i) the light is effectively de-coupled from the phosphor film, and (ii) the dimensions of the de-coupling region are maintained to be of the order of the phosphor film thickness (≈microns).

One technique, that is useful for the evaluation of lateral emission, is to form an edgy, or emitting facet in the phosphor film by etching or cleaving perpendicular to the substrate plane, thus providing edge emission. Such a technique, however, is difficult to apply to practical applications, particularly displays, where it is necessary to provide surface emission. Consequently, we have developed the technique that is the premise of this invention, namely the reflection of laterally transmitted light via micro-mirrors (reflecting micro-structures) fabricated onto the substrate. These reflecting micro-structures provide the means to de-couple the laterally transmitted light whilst maintaining the benefit of high intensity that results from internal reflection within the phosphor film. Examples are illustrated in FIGS. 3–5.

In summary, the invention Provides a TFEL device structure with a light emitting phosphor thin film disposed between dielectric thin films having a lower refractive index. Electrodes formed on the outer surfaces of the dielectric thin films provide the means to apply an ac drive signal to generate light within the phosphor film via the process of electroluminescence. A light emitting region is formed which consists of a reflecting microstructure configured so as to maximize the de-coupling of laterally transmitted light from the phosphor thin film in a direction away from the substrate. The light emitting region is protected with a cladding/outcoupling layer(s) which may be formed from a material having an index of refraction that is greater than or equal to the phosphor layer so as to increase the outcoupling efficiency. The TFEL device so described is fabricated onto a substrate in, or on which there is pre-fabricated the necessary electronic circuitry to provide individually addressable light emitting regions. The whole device thus forms an opto-electronically integrated high intensity multi-purpose light source.

According to the present invention there is provided a TFEL device structure with a light emitting phosphor thin film disposed between dielectric thin films having a lower refractive index. Electrodes formed on the outer surfaces of the dielectric thin films provide the means to apply an ac drive signal to generate light within the phosphor film via the process of electroluminescence. The device includes, or is fabricated adjacent to, reflecting micro-structures configured so as to maximize the amount of laterally transmitted light which may be de-coupled from the phosphor light generating film.

The reflecting micro-structures may take the form of micro-mirrors, micro-grooves, or tapered emitting facets in the phosphor or cladding materials, or any combination of these.

Photolithographic fabrication processes are preferably used to define the reflecting mi-crostructures into, or onto the substrate. They may take the form of dielectric structures with, or without an additional reflective coating, and may be shaped to provide the maximum reflection of light in the desired direction. Reflective coatings, such as metallic, or multi-layer dielectric mirrors may be added to the reflecting surface of the reflecting microstructure, but if such a reflective coating is electrically conducting it shall be isolated from the electrodes of the device, and/or addressing circuit. In such a way the reflecting microstructure is defined as a passive optical element within, or adjacent to the active light emitter (TFEL) device, also termed the light generating region.

TFEL device layers are then deposited via physical vapor, or chemical vapour deposition methods onto a substrate containing the reflecting micro-structures. Photolithographic techniques are used to define the surface electrodes and expose emitting regions corresponding to each reflecting micro-structure. The TFEL layers may be etched to expose an emitting facet corresponding to each reflecting microstructure. Cladding/outcoupling layers are then deposited to protect the emitting region. These layers may be composed of dielectric materials such as $SiO_2$, $Si_3N_4$, $BaTiO_3$, $Y_2O_3$, or graded index combinations thereof to provide an optimum transmission of the particular wavelength of light generated by the phosphor layer, or they may be composed of materials with a refractive index≧that of the phosphor thin film in order to maximize the optical outcoupling, e.g. ZnSe, TiO.

Electrical addressing of t he TFEL structure so described is facilitated by electrically connecting the bottom electrode of the device to the drain, or extended drain of a MOSFET, and/or onto the electrode of a shunt capacitor, grounding the source of the MOSFET and providing a high voltage ac supply line to the top electrode of the TFEL device, such that when the MOSFET is turned on, emission from the TFEL device is initiated. Said emission being reflected by the reflecting micro-structures to produce a high intensity light source that may be turned on or off by the application of a small voltage signal to the gate of the MOSFET.

Individually addressable light sources may thus be configured to form a linear array of high intensity light sources, a matrix of light sources, or a group of fixed legend light sources. The geometrical arrangement of the reflecting microstructures may further be configured so as to provide the maximum light intensity by optimizing the spacing between them, i.e. adjusting the ratio of active light generation area to reflecting/de-coupling area.

The configuration of devices forming an array of high intensity light sources is of particular importance for application electrophotographic printing Market factors dictate that the resolution of such printers must be greater than 300 dots per inch (dpi). Apart form laser/polygon exposure systems, low cost solutions include arrays of discrete surface emitting LEDs, but ultimately the resolution of such an array is limited by the necessity to form a wire bond to each device. The edge emitting TFEL device structures proposed by Westinghouse and Edge Emission Inc., as discussed in the prior art section above, provide another alternative. However, due to the problems associated with using an emitting facet at the edge of a substrate such technology has yet to form a commercially viable product. The present invention, therefore, provides an improved light source for this application. Accordingly, there is provided an array of TFEL devices formed in combination with reflecting micro-structures as described above, where each individually addressable device forms the light source corresponding to a printed picture element. A further possible embodiment of such an array is one in which selection of a particular device addresses a pair of TFEL structures where a reflecting microstructure located between this pair of light generation regions results in the reflection of light away from the substrate to form a single light source. This increases the active light generating area that is contributing to the light source, and so increases the intensity to facilitate the exposure of a light sensitive medium. Furthermore, by combining laterally transmitting TFEL devices with reflecting microstructures, cladding/outcoupling layer(s), and integrated addressing drive circuitry, it is possible to increase the switching frequency of the devices and thus increase the achievable printing speed.

It will be obvious to those skilled in the art that the invention thus described may be applied to any TFEL materials where lateral transmission of light is facilitated by internal reflection. Consequently, the invention applies to the full range of thin film phosphors that may be employed in TFEL devices, and can therefore produce high intensity light sources with an emission wavelength that is designed for the application under consideration. For example, ZnS:Mn may be used to produce broad-band yellow light for multi-colour display, and/or printing applications,; SrS:Ce for white light emission, and $ZnS:TmF_3$ could be used to produce blue light which is useful for displays, and infra-red emission that is suitable for printing. Finally, it is possible to produce devices, arrays of devices, or matrices of devices, where multiple deposition steps, or ion implantation is used to selectively dope different regions of the phosphor thin film. In this way a multi-colour, or full-colour light source is defined.

Embodiments of the present invention will now be described and contrasted with the prior art, by way of example only, and with reference to the accompanying drawings, in which:

FIG. 1 is a schematic cross section of a conventional TFEL display structure,

FIG. 2 illustrates the process of internal reflection, and lateral transmission, in a conventional TFEL device, FIGS. 3a, 3b and 3c illustrate variations in the use of micro-mirrors, in a TFEL device structure according to the present invention, FIG. 3d illustrates the use of a reflective coating over the reflecting micro-structure, FIGS. 3e and 3f illustrate preferred embodiments of the invention, comprising TFEL devices formed onto substrates having pre-fabricated addressing/drive circuitry, incuding reflecting micro-structures and cladding layer, FIGS. 4a through 4f illustrate different possible geometries of micro-structures, FIG. 5 illustrates an array of emitting apertures included in a single pixel, FIG. 6 illustrates yet another possible geometry of reflecting micro-structures, FIG. 7 illustrates a further possible configuration of emitting aperture, FIG. 8a illustrate a geometry suitable for use in high intensity, high resolution linear arrays, FIG. 8b is a cross section of a light source of FIG. 8a, FIG. 8c is an exploded view of an individually addressable light source according to the invention, FIG. 9 (incorporating FIGS. 9a and 9b) illustrate examples of the TFEL light source according to the invention, in active matrix configuration in FIG. 9a and passive matrix configuration in FIG. 9b, and FIG. 10 illustrates the use of a latching element to facilitate active matrix addressing.

Referring to the drawings, FIG. 1 depicts a typical conventional TFEL structure comprising an active phosphor layer 1 sandwiched between dielectric layers 2a and 2b (which may or may not be the same material) with a transparent electrode 3 on one outer surface and an electrode 4 on the opposite outer surface. The device is foxed onto a transparent substrate 5 such that when an ac voltage of sufficient value to initiate electroluminescence is applied across the electrodes 6 light 7 is generated, with surface emission viewed (8) through the substrate 5.

FIG. 2 illustrates the process of lateral transmission of internally reflected light. A conventional TFEL device as in FIG. 1 has dielectric layers 2 whose refractive index $n_2$ is less than that $n_1$ of the phosphor layer 1. Light generated via electroluminescence 7 is trapped within the phosphor thin film if the angles of incidence with the dielectric layers 9 are less than the critical angle for internal reflection, resulting in laterally transmitted light 10.

In FIGS. 3–7 the substrates may be transparent, or opaque. In the preferred embodiment, the device forms an opto-electronic integrated circuit, with the laterally transmitting TFEL device, reflecting microstructures, cladding/outcoupling layers and integrated addressing/drive circuitry. In one version of the preferred embodiment of this aspect of the invention, the TFEL device is deposited onto, or near to a drive/addressing circuit pre-fabricated into or onto the substrate e.g. silicon, SOI, or SOS. Said circuit is fabricated such that when activated via low voltage data signals, a high voltage drive signal is applied across the TFEL device and light emission from the TFEL device is initiated.

In the Figures depicting possible embodiments of the invention, therefore, it is implicit that the substrate shown may contain such pre-fabricated circuitry. Furthermore, the active elements of such circuitry may be so configured as to be located beneath the reflecting micro-structures, which are passive elements, or beneath the TFEL layers, or a combination. Furthermore, in such a configuration, each individual light source would be associated with its own addressing/drive circuit (termed collectively—latching element). In such a configuration the light sources may form an array, for printing applications, or a matrix, or fixed legends, for display applications. An alterative configuration of this aspect of the invention would thus be the integration of addressing/drive circuitry along the periphery of the display/printing array regions. With this configuration a refresh mode of operation (which may be termed—passive matrix) is employed. For both configurations, the integration of laterally transmitting TFEL devices with reflecting microstructures, cladding/outcoupling layer(s), and latching circuit elements, or any sub-combination of these, results in devices to satisfy the requirement for multi-purpose high intensity, high resolution light sources.

As illustrated in FIGS. 3a, and 3b, photolithography and fabrication processes can define reflecting microstructures consisting of micro-mirrors 11 (points, wedges), on a substrate 5 which would preferably contain pre-fabricated addressing/drive circuitry (latching elements plus logic stages) thus facilitating active, or passive addressing. These processes are performed prior to the deposition of the TFEL layers comprising phosphor thin film 1, dielectric layers 2a, 2b and electrode 4, where the surface electrode layer 4 may be opaque, or transparent. Ideally, the reflecting microstructure is reflecting for the wavelength emitted by the particular phosphor employed, hence an additional reflective coating 14 may be formed over the reflecting microstructure, as shown in FIG. 3d where this coating is a metallic, or dielectric mirror. If the coating is metallic then it is isolated electrically from the substrate, TFEL device, and top electrode. Micro-machining by, for example, etching, ion milling, or laser ablation can be used to define an emitting facet 12 in the TFEL device in the region of the reflecting microstructures. These facets are in close proximity to the reflecting microstructures as shown in FIG. 3a, resulting in the reflection of laterally transmitted light 13. FIGS. 3a–3c show possible variations of this configuration.

The profile of the reflecting microstructure 11 is such that it enables laterally transmitted light to contribute to surface emission. A shaped mirror surface (not shown) allows control of the preferred direction of the surface emission. Etching of the TFEL emitting facets may be performed such that all of the TFEL layers 4, 2a, 1, and 2b are removed (as shown in FIG. 3a), or a reduced combination of these, as shown in FIGS. 3b and 3c. Where layer 2b is not removed by the etching process (FIG. 3b) this layer forms a coating of the reflecting microstructure and may thus also fulfill the requirement of the reflective coating 14.

FIGS. 3e, and 3f illustrate the preferred embodiments of the invention. TFEL devices (layers 1,2a,2b,4) are formed onto substrates, 5 with addressing/drive circuitry prefabricated, and reflecting microstructures 11, with the light emitting region being coated with an additional layer 15, to form a protective cladding, and improve the outcoupling of emitted light. This layer may thus have refractive index that is greater than or equal to that of the phosphor layer 1, such that light outcoupling is improved. Additionally, further layers 16 may be deposited to form an anti-reflection coating tailored to the wavelength emitted by the phosphor.

If the electrode layer 4 is not transparent, then it may be a dark, or black material, or may be coated with the same. This facilitates improved contrast ratios. Only the intense reflected laterally transmitted light is observed/detected. Furthermore, an inherent property of the invention is that the use of reflecting microstructures to de-couple laterally transmitted light is that light spread between individual pixels, or elements is prevented. This means that optical cross-talk is eliminated, further enhancing both the efficiency and contrast from these light sources.

Photon emission from radiative centers within the phosphor thin film can either contribute to conventional surface emission —a transparent electrode is used-, propagate laterally, or be absorbed or scattered into an absorbing region. Hence, to maximize the overall luminous efficiency of a light source composed of individual light sources as defined by this invention, it is necessary to optimize the geometry of the emitting regions, i.e. the reflecting microstructures. In particular:

(i) The area fill-factor of emission within the pixel area should be as high as possible.
(ii) The mean propagation length of laterally transmitted light should be optimised as determined by the attenuation coefficient of the particular phosphor thin film used.
(iii) No lateral light should propagate to adjacent pixels
(iv) The cross-sectional profile of the microstructure(s) should optimize the conversion of laterally transmitted light into useful surface emission.

Hence, shown in FIGS. 4–6, by way of example only, are possible geometries of microstructures that may be employed for optimizing the light out-coupling. The Figures illustrate plan views of typical pixels.

The area fill factor is dependent upon the spatial frequency and foot print size of the emitting apertures 17 as defined by the reflecting microstructures and emitting phosphor facets. Various configurations are suggested by FIG. 4a–4f, where the spacing period (x and y) would be adjusted to optimize the out-coupling efficiency.

FIG. 5 shows an example of an array of emitting apertures 17, in the form of internal reflecting microstructures and emitting facets which form rectangular apertures making up a single pixel. Also shown is a perimeter reflecting microstructure 18 defining the perimeter of the pixel and preventing optical cross-talk. The spacing of the emitting apertures would be optimised according to the attenuation properties of the phosphor material used.

Figure 1:
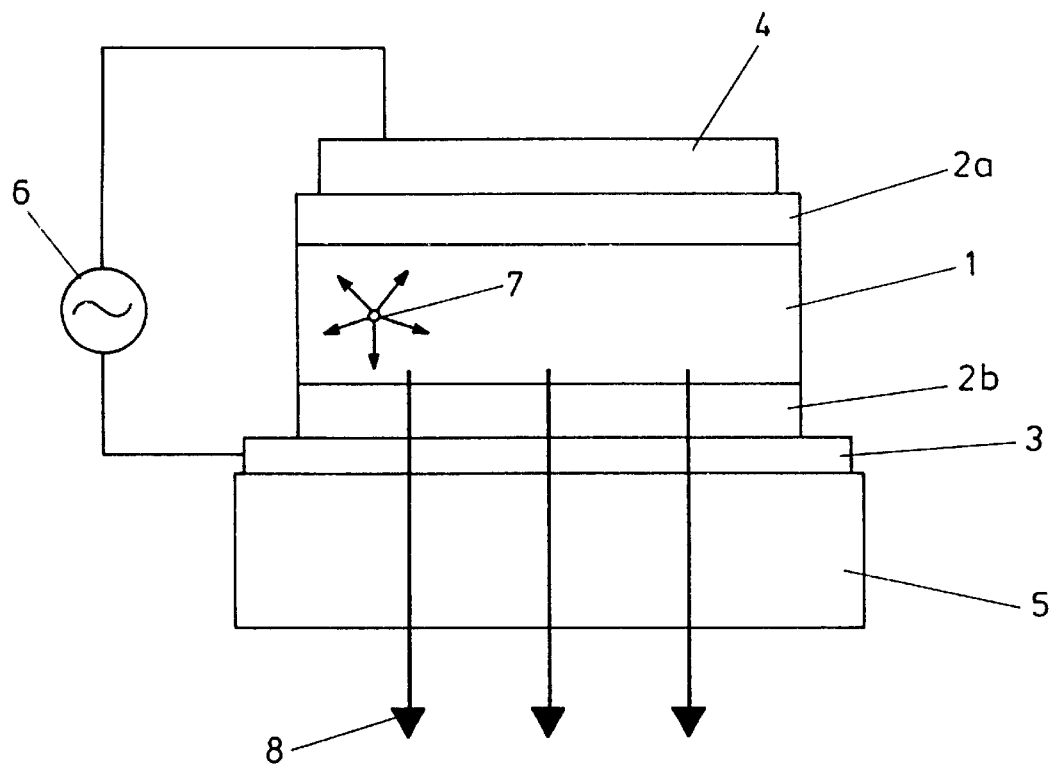
Figure 2:
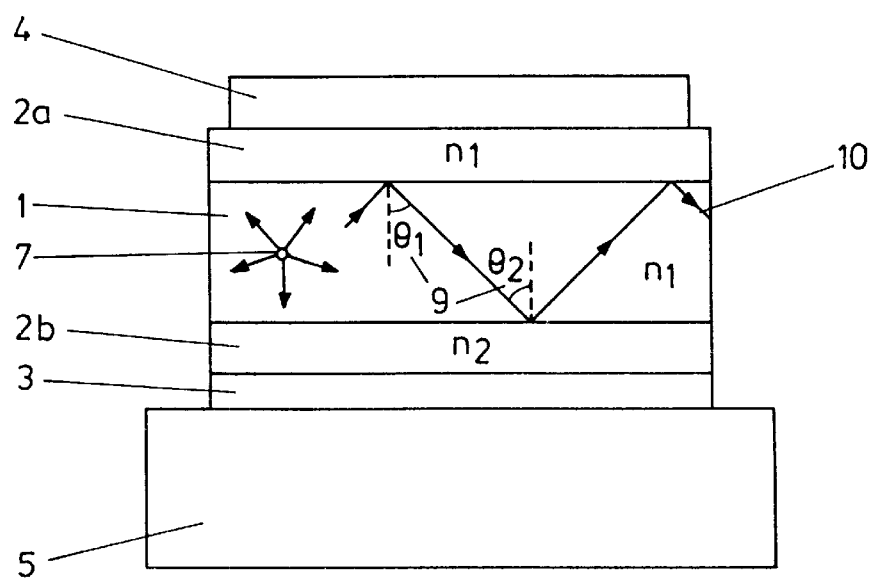
Figure 3A:
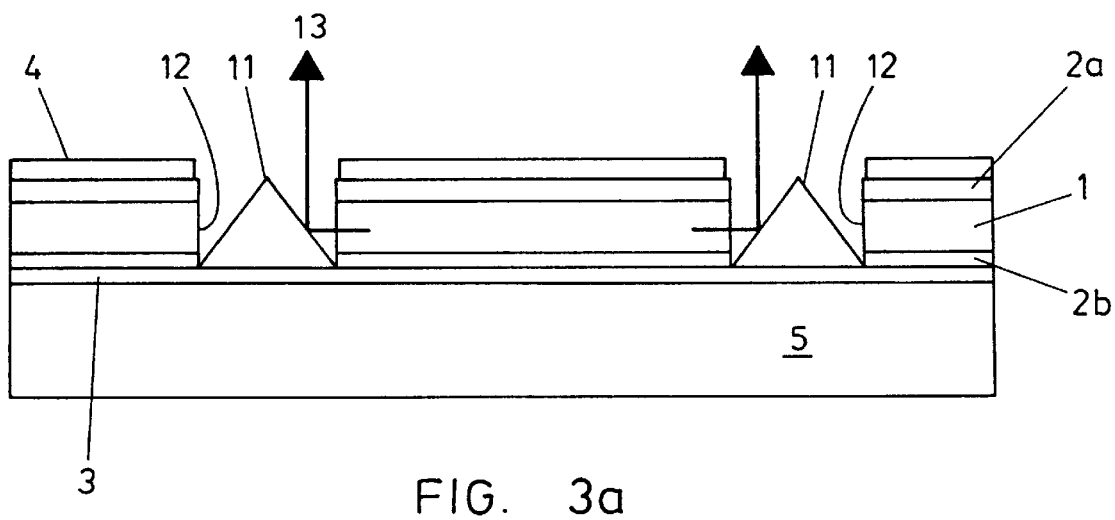
Figure 3B:
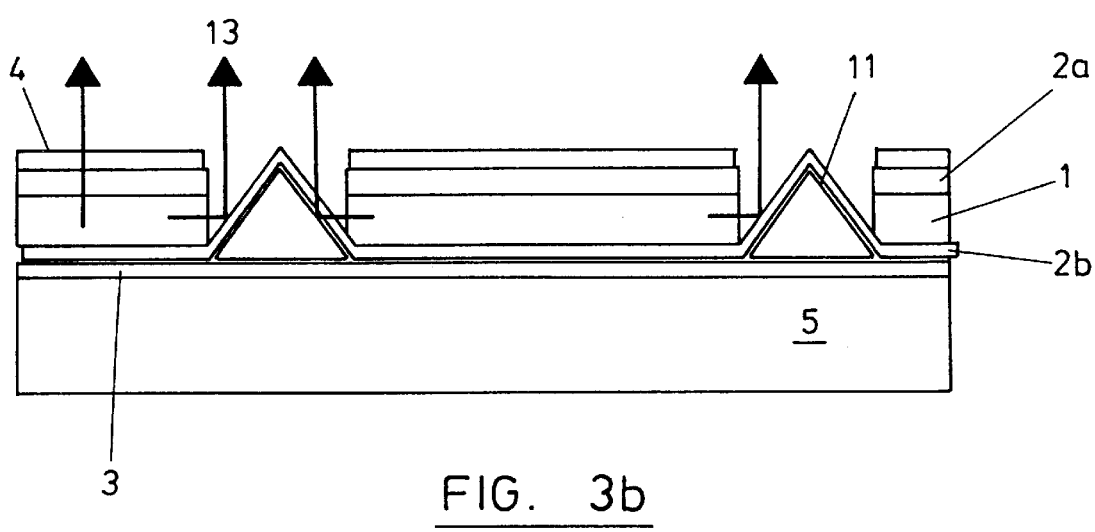
Figure 3C:
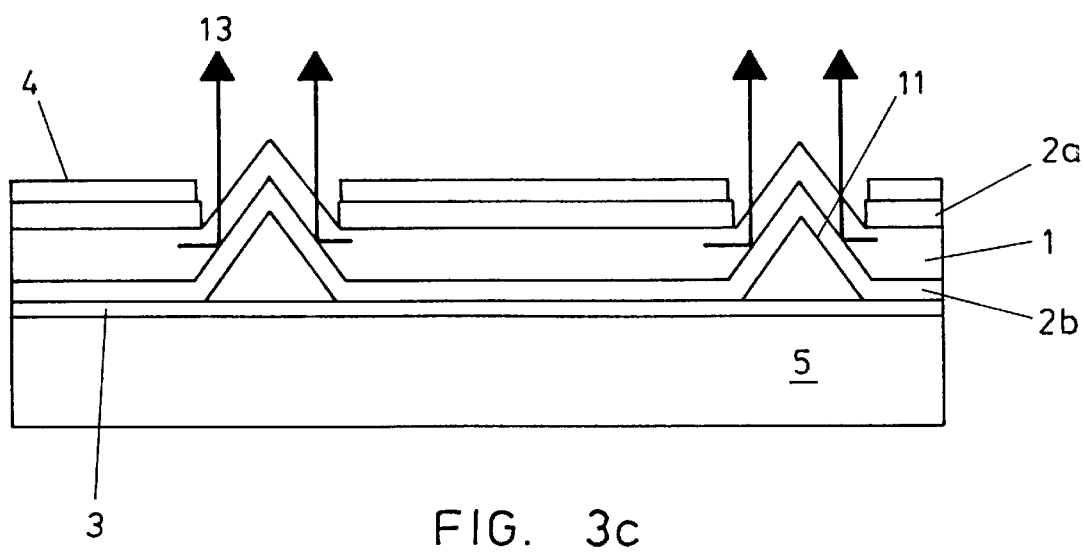
Figure 3D:
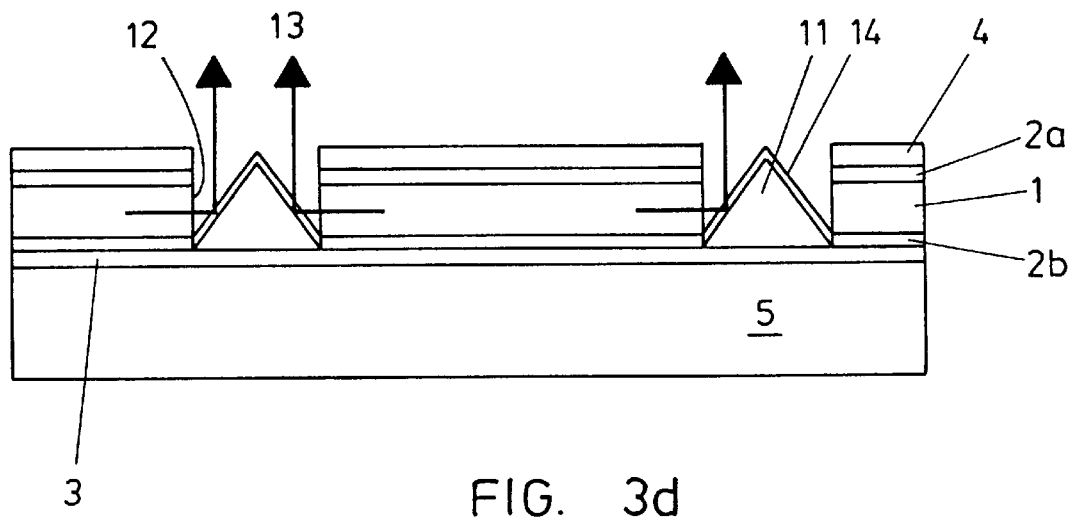
Figure 3E:
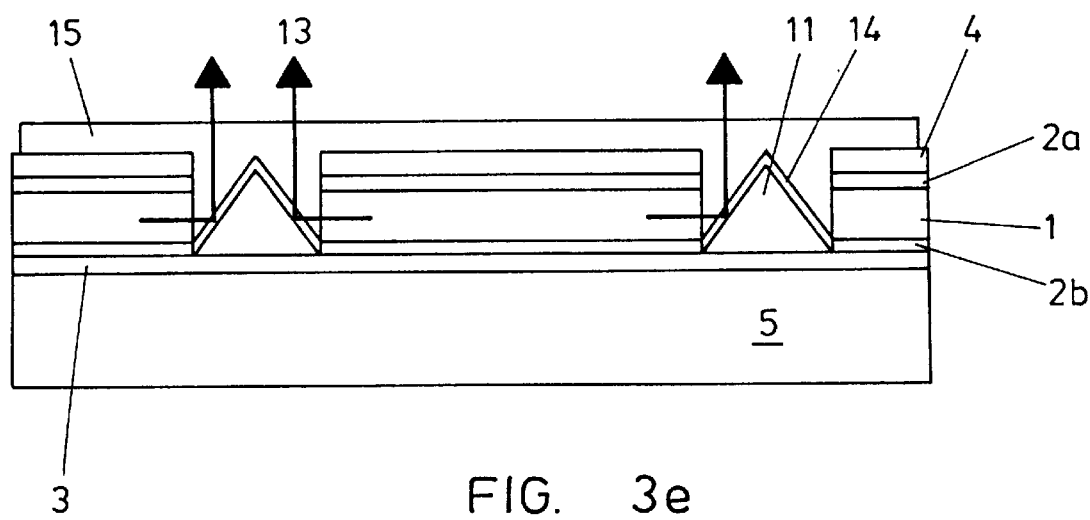
Figure 3F:
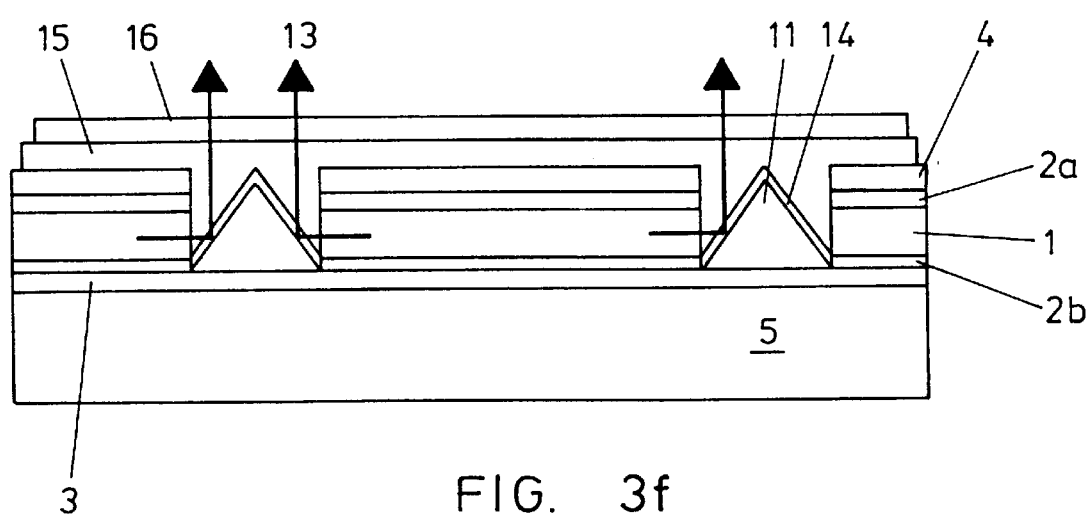
Figures 4A, 4B:
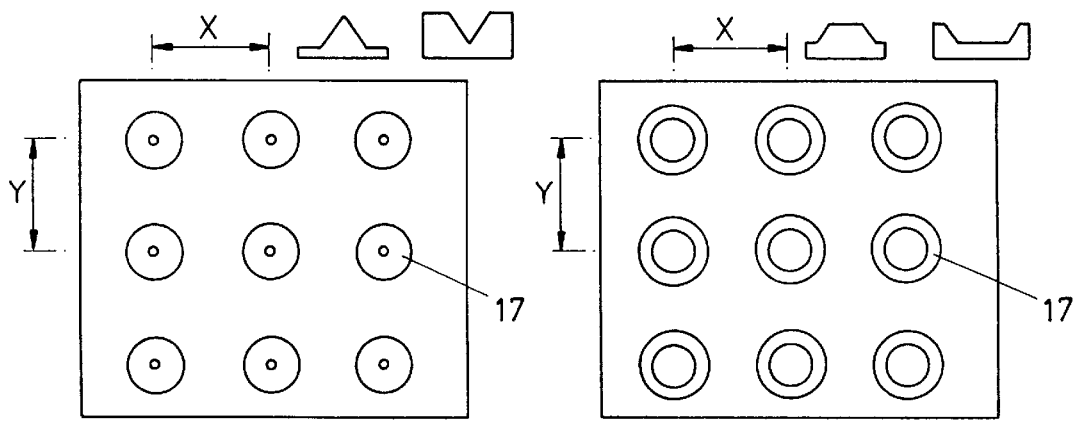
Figures 4C, 4D:
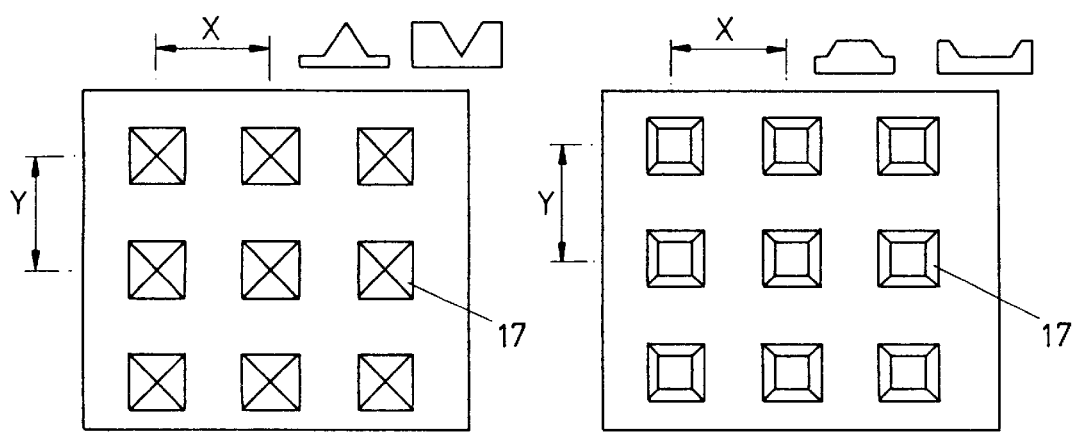
Figures 4E, 4F:
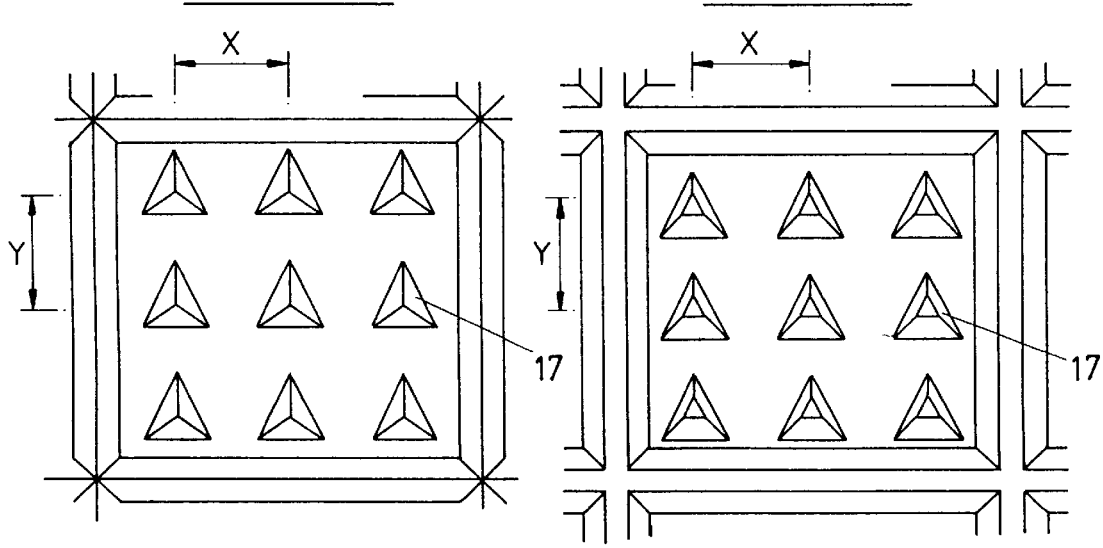
Figure 5:
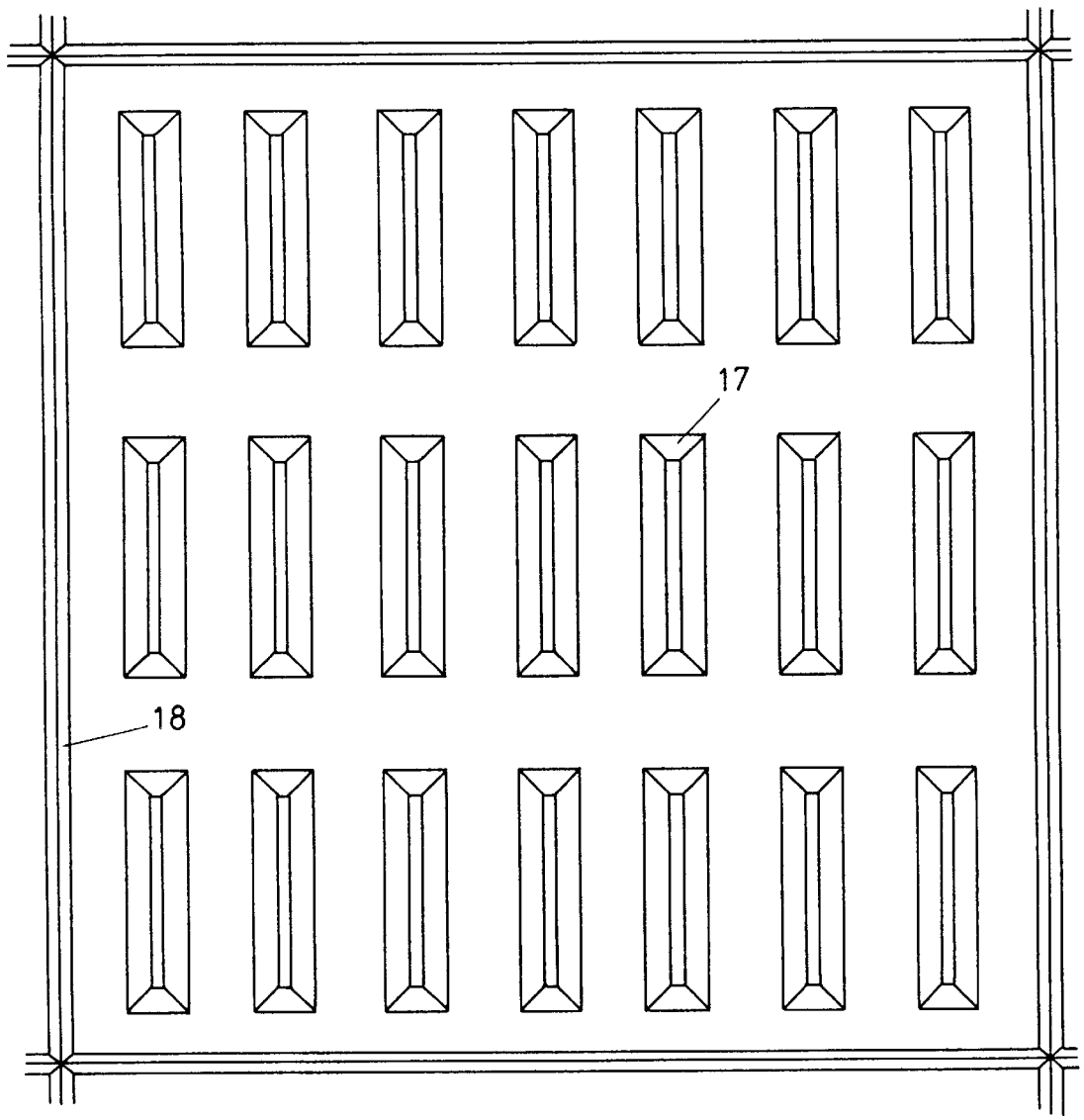
Figure 6:
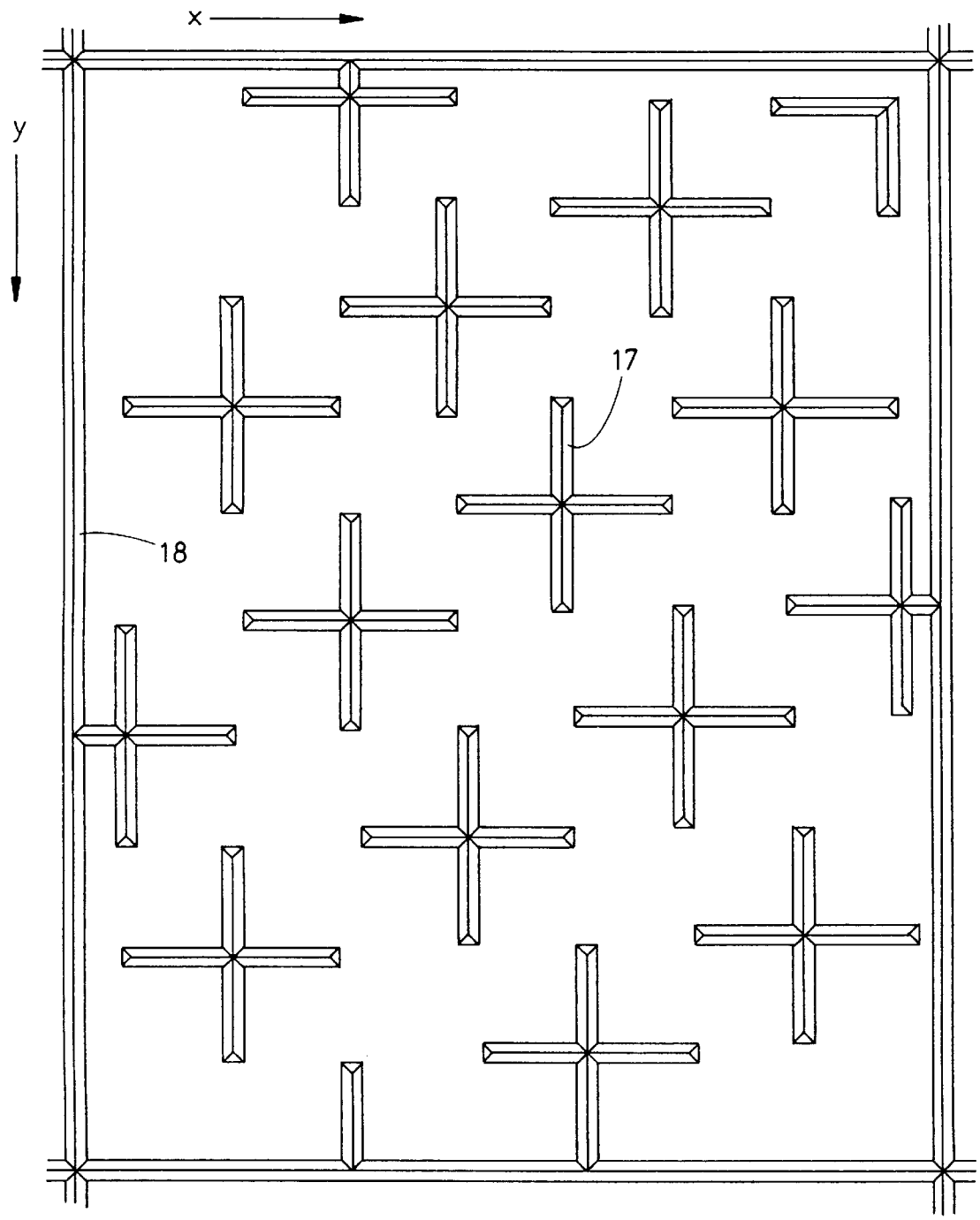
FIG. 6 shows yet another possible geometry of reflecting microstructures. With this geometry, the extent of lateral propagation can be controlled equally in both x and y directions.
Figure 7:
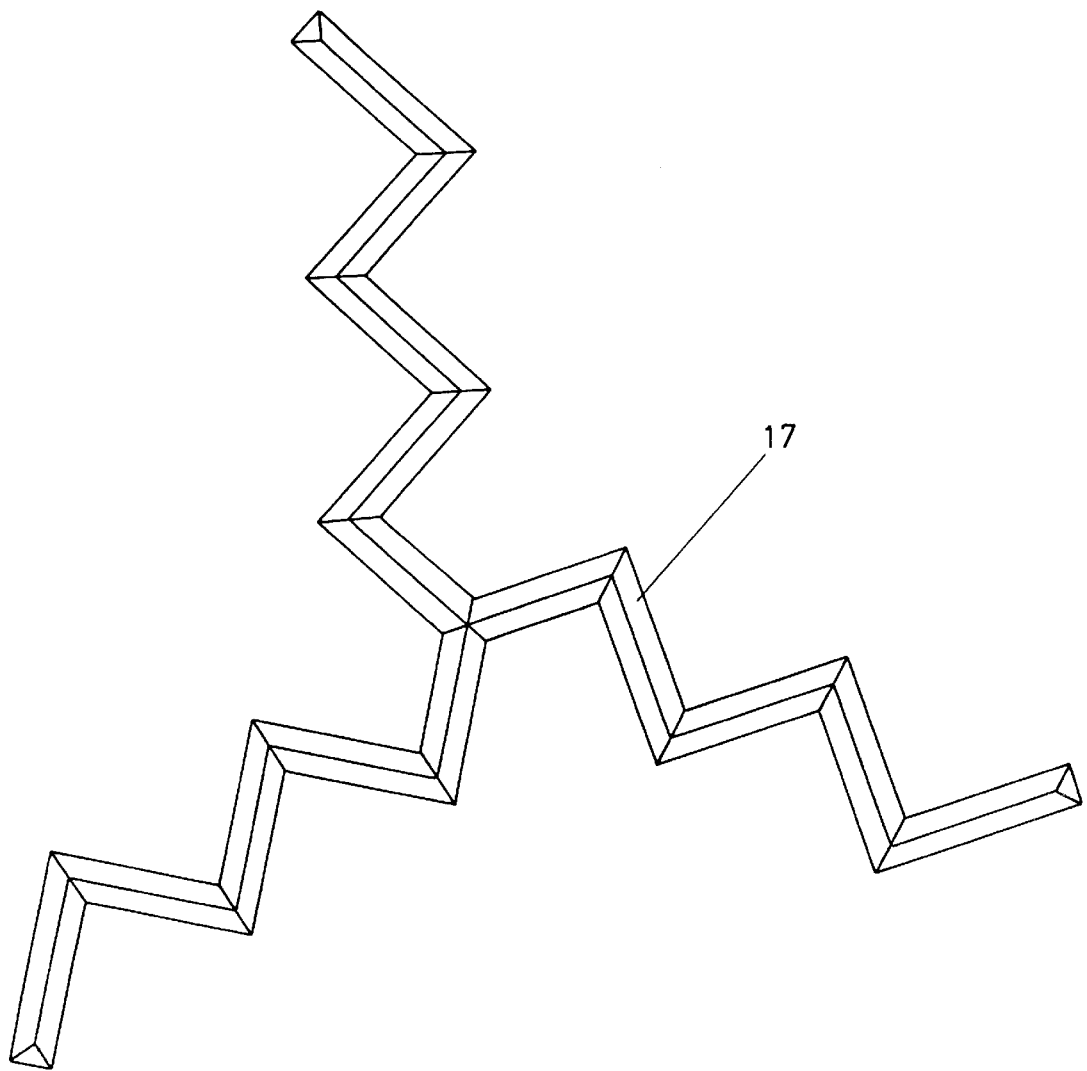
FIG. 7 illustrates yet another possible configuration of the emitting aperture 17, where the arms of a three pointed star are formed by the reflecting microstructure such that the shape provides multiple angles for reflection via its jagged profile. This will improve the light out-coupling by increasing the probability of the reflection of laterally transmitted light.
Figure 8A:
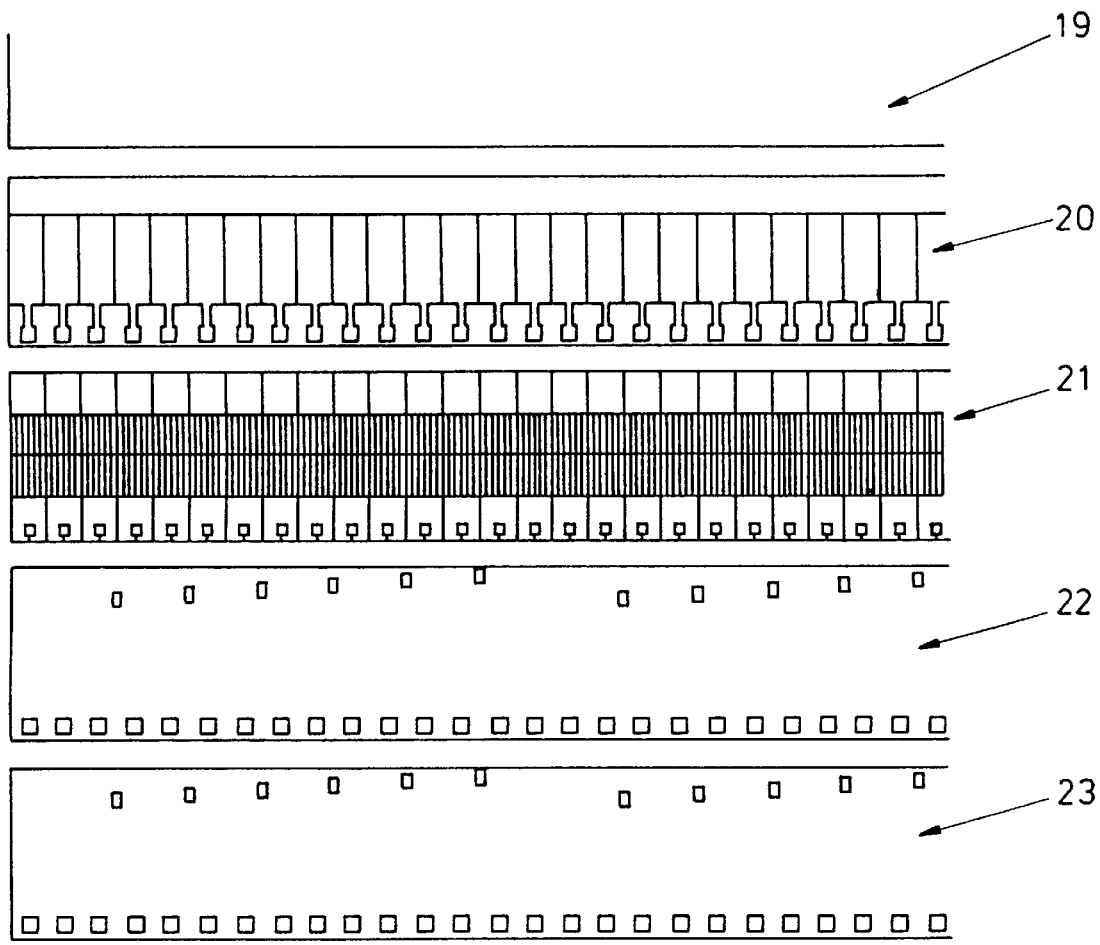
Figure 8B:
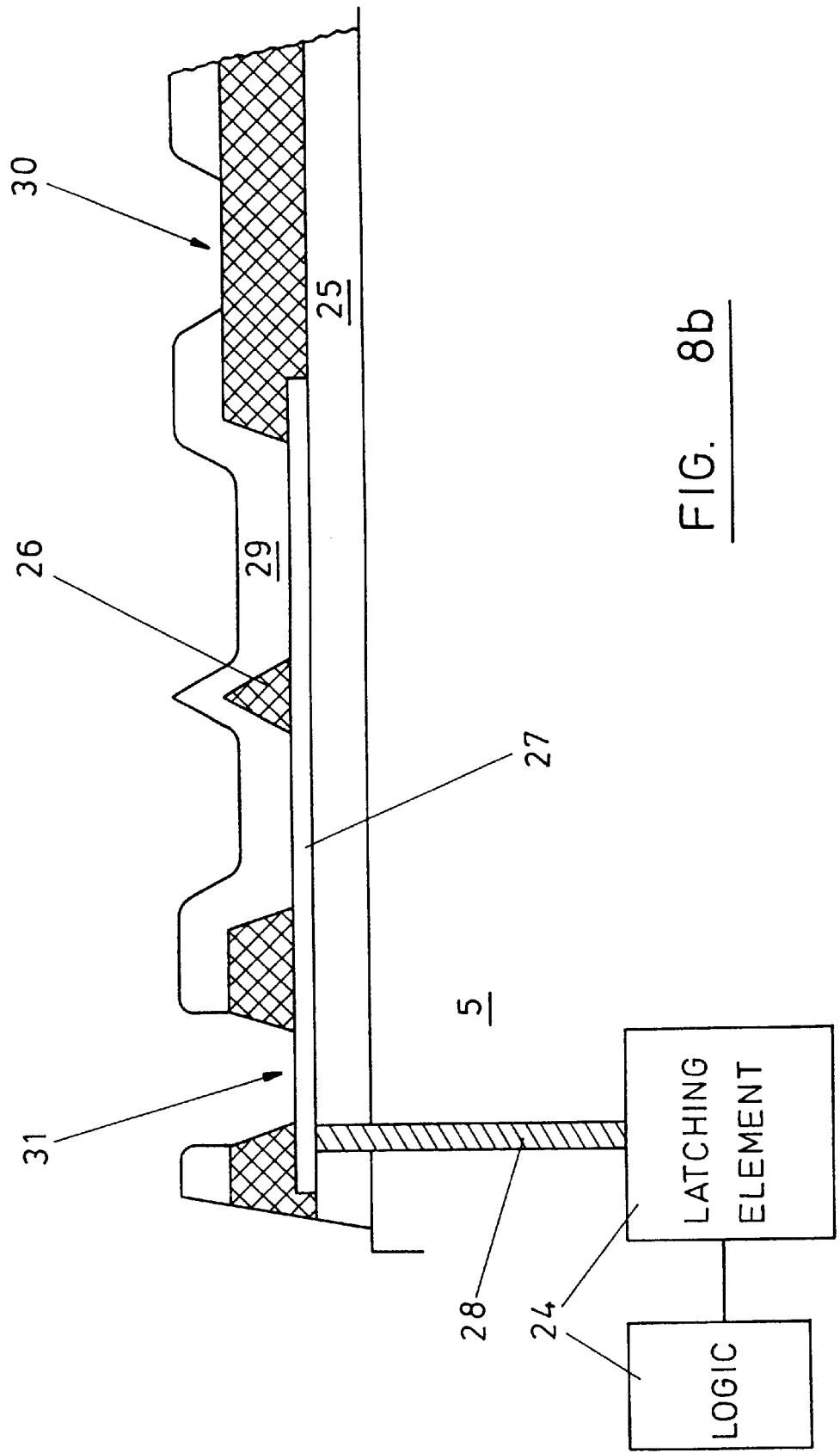

For applications requiring linear arrays of high intensity, high resolution light sources, the geometry may be defined as indicated by FIG. 8a, which shows a possible etching pattern for such an array. This comprises PECVD $SiO_2$ insulating raft etch 19, polysilicon electrode etch, 20, $SiO_2$ (dielectric reflecting microstructure material) etch 21 for side walls, micro-mirrors, and via holes to base electrode (not required if addressing/drive circuitry is included into the substrate only top electrode connections are required to provide the high voltage drive signal), TFEL device etch 22 to form via holes, or TFEL etch 23 to form via holes and emitting facets (again, via holes only required when addressing circuitry is not included in/on the substrate). FIG. 8b shows a cross-section of this possible configuration of light source, comprising the substrate 5 which may, or may not contain addressing/drive circuitry 24, an insulating layer 25, a reflective microstructure 26 which may be coated with a reflective coating, the base electrode layer (eg. polysilicon) 27 which is connected to the drain or extended drain and or a shunt capacitor of the addressing circuit latching element 24 via an electrically conducting region 28, TFEL layers 29, and high voltage bondpad 30. Alternatively, as also indicated, if no addressing/drive circuitry is included in the substrate, then a low voltage bondpad 31 is formed to facilitate electrical connection to the base electrode. It is thus apparent that the full preferred embodiment of the invention, i.e. the integration of the TFEL laterally transmitting device with reflecting microstructures, cladding/outcoupling layer (s) and addressing/drive circuitry is preferable due to the reduction of fabrication steps, and the number of wire bonds that are required, thus improving cost, efficiency, and yield. It is clear, however, that any sub combination of the aspects of this invention may be employed to provide an improvement over prior art structures.

Figure 8C:
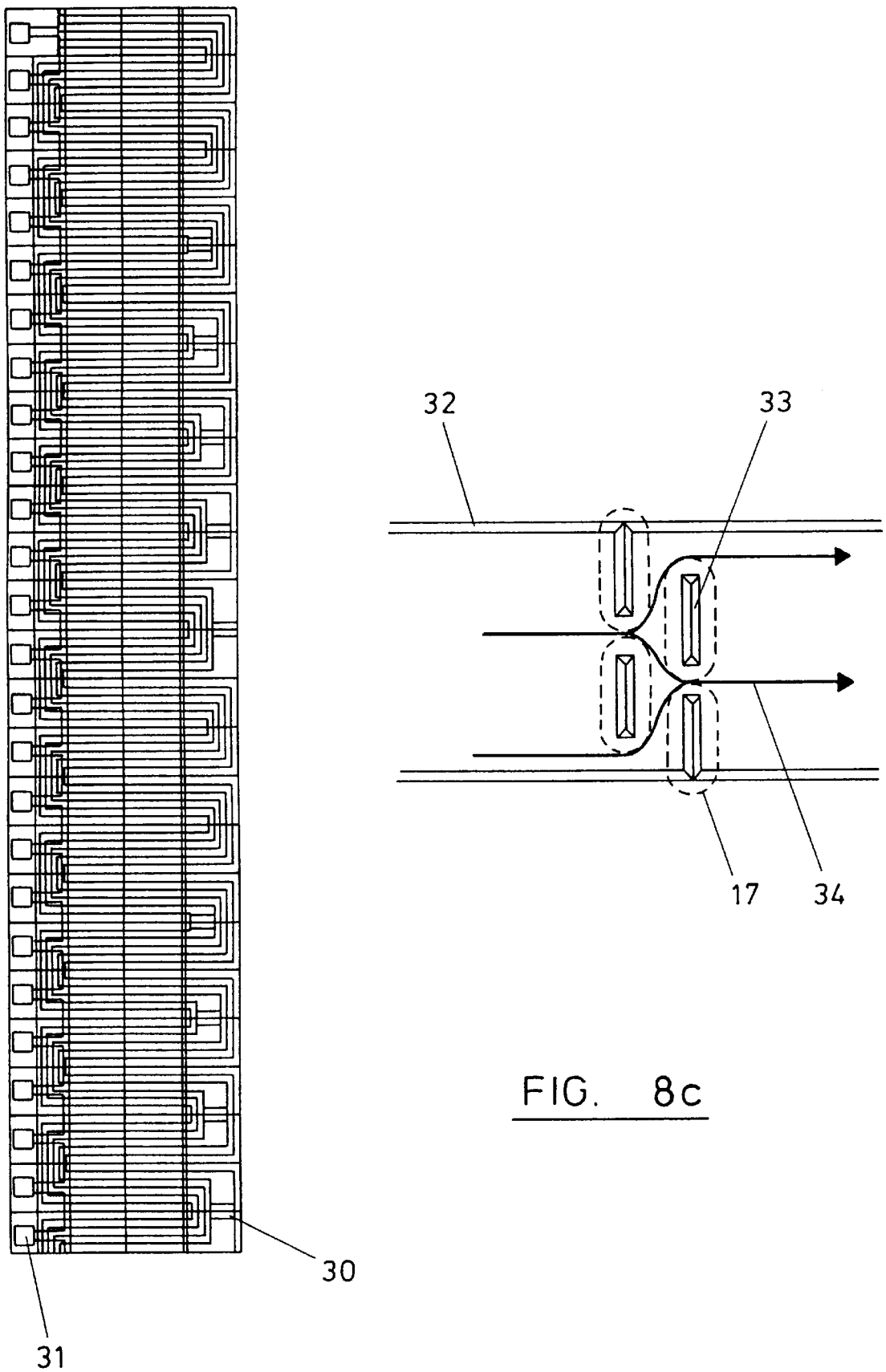

FIG. 8c depicts an exploded view of an individually addressable light source according to the invention that would be suitable for the configuration of a linear array, as is required for printing applications. The drawing illustrates how the electrical conductivity can be maintained around the emitting apertures 17, but with laterally transmitted light from the TFEL regions either side of the reflecting microstructures contributing to the reflected emission—thus increasing the light energy emission and thereby enhancing the luminous efficiency of the light sources. Sidewall reflecting microstructures 32 prevent optical cross-talk and the electrical path 34 (typically deposited aluminium) weaves in a continuous line around the reflecting microstructures 33. Thus only a single level of top electrode metallisation is required, for reduced processing steps and hence higher process yield.

Typically, the dimensions of the individual light sources of such a linear array for printing applications would be 42.5 micrometres ($10^{-6}$m) from sidewall 32 to the next side wall 32, for 600 dots per inch printing resolution. Correspondingly smaller dimensions would facilitate higher resolutions.

Figure 9A:
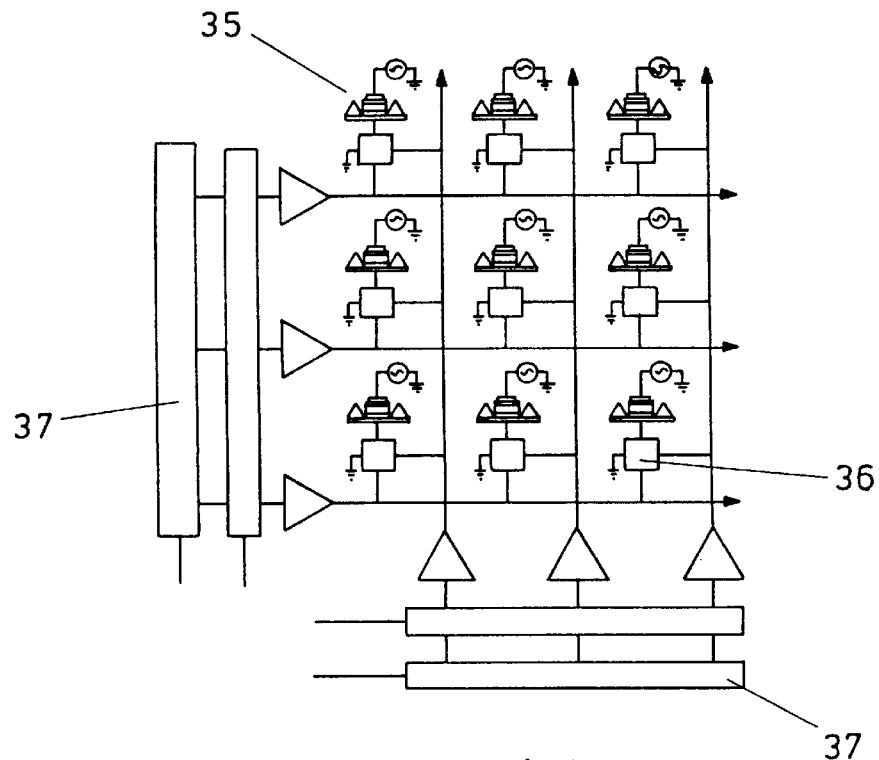
Figure 9B:
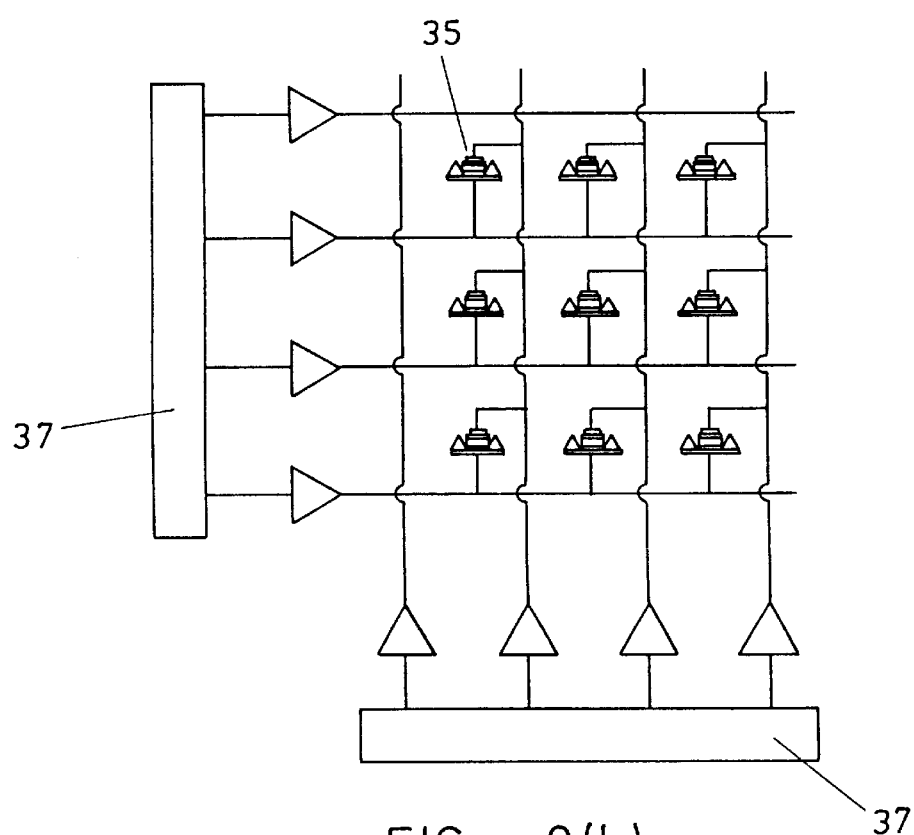

FIGS. 9(a) and 9(b) depicts examples of the overall electrical geometry of the preferred embodiment of the invention—a multi-purpose opto-electronic integrated high intensity reflecting laterally transmitting TFEL light source. Shown schematically in FIG. 9a is an active matrix configuration, and FIG. 9b shows the corresponding passive matrix configuration. For both cases the addressing/drive circuitry (or part thereof) is fabricated into or onto the substrate prior to the formation of the reflecting microstructures and TFEL layers. In active matrix format, each separate light source, or light source region 35, is individually controlled via an associated latching element 36, such that the application of a low voltage data signal via the logic stage(s) 37 permits the selection of the light source(s) to be on or off. A linear array of such devices in actively addressed configuration would thus correspond to a single row of the matrix indicated by FIG. 9a. For passive matrix addressing, as shown in FIG. 9b, the addressing/drive circuitry is located on the periphery of the light source region(s). The devices are then addressed via a refresh operation—row by row. Again a linear array of light sources would thus correspond to a single row of such a configuration, or alternatively may be composed of groups of several rows to form a multiplexed array.

Figure 10:
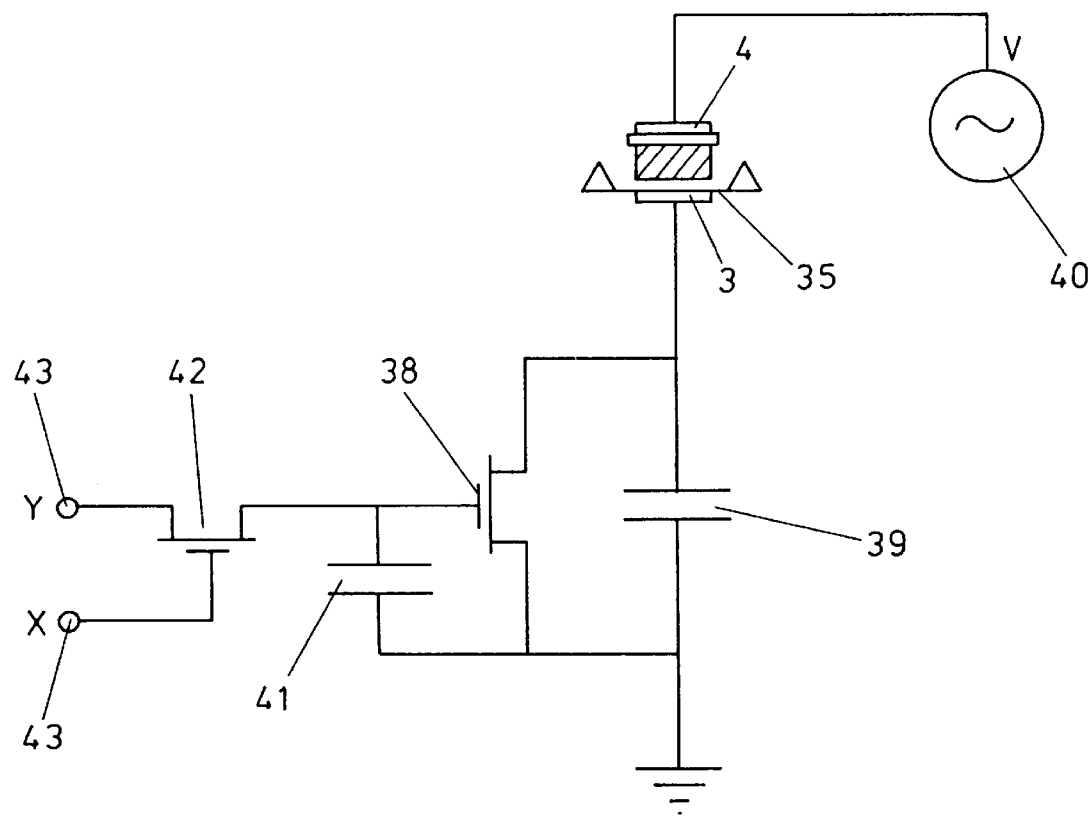

FIG. 10 illustrates a possible configuration for the latching element that facilitates active addressing. The TFEL device with reflecting microstructures 35, is connected to the drain, or extended drain of a MOSFET 38 and to the electrode of a shunt capacitor 38. A high voltage ac supply 40 is connected to the top electrodes) of the device. The state of MOSFET 39 is controlled by the state of the addressing element composed of a storage capacitor 41 and a MOSFET 42. Logic signals are applied via the interconnects X and Y 43 to control the circuit. As shown in the truth table, the selection of appropriate combinations of data signals allows the TFEL device to be turned on, turned off, or to remain in its present state. When turned on, the channel MOSFET 38 becomes conducting such that the drain is connected to the source which is maintained at ground potential. The high voltage drive signal 40 is then applied directly across the TFEL device such that the light emission is initiated. When turned off, closing the channel of MOSFET 38, the high voltage drive signal is divided between the capacitative elements of the TFEL device and shunt capacitor 39 (which may be an integral part of the circuit, or MOSFET 38). The value of shunt capacitor 39 is thus selected so as to ensure that the resultant reduced voltage across the TFEL device is below the threshold value necessary for electroluminescence, thus turning the TFEL device off.

REFERENCES

[1] Y.A Ono; Electroluminescent Displays, World Scientific, series on Information Display (1996)
[2] D.H. Smith; J Lum 23 (1983) 209/
[3] J. Wilson, and J. F. B. Hawkes; Optoelectronics an Introduction, Prentice Hall International, (1983) 211.
[4] J. Vanterfleteren et al; Conference Record of the 1991 International Display, 134 Conference.
[5] C King; Proceedings of EL 96, Berlin (1996) 375.

We claim:

1. A light emitting apparatus comprising:
   one or more thin film electroluminescent devices, wherein each said device comprises:
      a light generating active phosphor layer sandwiched between dielectric layers fabricated onto a planar substrate, wherein said phosphor layer has a thickness in a direction away from said planar substrate;
      electrodes formed on the outer surfaces of the dielectric layers, wherein said electrodes provide an AC drive signal to said device thereby causing a generation of light within said phosphor layer by electroluminescence, at least a portion of the light being transmitted substantially laterally to said substrate;
      a de-coupling means for decoupling the laterally transmitted light away from the plane of the substrate, wherein said de-coupling means includes a light reflective surface having a predetermined contour, and wherein said light reflective surface extends across said phosphor layer thickness.

2. A light emitting apparatus as claimed in claim 1, wherein for each said device, said de-coupling means comprises one or more associated reflective structures fabricated one of: in and onto the substrate of at least one of said reflective structures providing said light reflective surface.

3. A light emitting apparatus as claimed in claim 2, wherein for each said device, the device includes an emitting aperture comprising an emitting facet formed in the phosphor layer such that the laterally transmitted light emitted from said emitting facet is reflected by one of said associated reflective structures.

4. A light emitting apparatus as claimed in claim 2, wherein the reflective structures are coated with one of: a metallic, and a dielectric reflection coating to enhance a reflectivity of the reflective structures at a particular one or more wavelengths emitted by the phosphor layer.

5. A light emitting apparatus as claimed in claim 3, wherein for each said device, the emitting aperture is filled or coated with at least one optically transparent material having a low coefficient of attenuation at one or more wavelengths of light emitted by the phosphor layer.

6. A light emitting apparatus as claimed in claim 5, wherein for each said device, the at least one optically transparent material coating of the emitting aperture has a refractive index at least equal to that of the phosphor layer so as to form an optical transmission region between the phosphor layer and at least one of the associated reflective structures.

7. A light emitting apparatus as claimed in claim 3, wherein for each said device, a top surface of the emitting aperture is coated with an anti-reflection coating to enhance a transmission of light that has been reflected by at least one of the associated reflective structures.

8. A light emitting apparatus as claimed in claim 1, wherein said devices form an array of devices, wherein each said device is individually addressed electrically to form a high resolution image bar.

9. A light emitting apparatus as claimed in claim 3, wherein for each of at least some of said devices, at least one of the associated reflective structures has two mutually inclined reflecting surfaces, and the at least one associated reflective structure is located between the emitting apertures of two active phosphor layers of two of said devices for thereby providing a single light source when the transmitted light is emitted from each emitting aperture of the two active phosphor layers.

10. A light emitting apparatus as claimed in claim 9, wherein each said device is individually addressed electrically for forming an array from said one or more devices such that said array provides a high resolution image bar.

11. A light emitting apparatus as claimed in claim 1, wherein said devices are configured to provide a matrix of individually addressable pixels to form a high resolution display.

12. A light emitting apparatus as claimed in claim 1, wherein each said device is electrically connected to addressing/drive circuitry fabricated into or onto the substrate to facilitate active matrix/active array addressing.

13. A light emitting apparatus as claimed in claim 1, wherein each said device is electrically connected to addressing/drive circuitry fabricated into or onto the substrate to facilitate passive matrix/passive array addressing.

14. A light emitting apparatus as claimed in claim 1, wherein each said device is fabricated by depositing the device onto at least one of: a drain, an extended drain of a MOSFET, and an electrode of a shunt capacitor and wherein top and bottom contacts are provided to the device, grounding a source of a MOSFET and providing a high voltage supply line to the top contact of the device such that when the MOSFET is turned on, emission from the device is initiated and light is de-coupled by the de-coupling means in a direction away from the plane of the substrate, said emission being capable of being turned on or off by an application of a small voltage signal to a gate of the MOSFET.

15. A light emitting apparatus as claimed in claim 14, wherein each said MOSFET is not required to operate in its breakdown region.

16. A thin film electro-luminescence device, comprising:
a light generating phosphor layer sandwiched between dielectric layers fabricated onto a surface of a substrate, wherein said phosphor layer has a side substantially traverse to said surface, and wherein said phosphor layer has a thickness in a direction away from said surface;
electrodes formed on opposed outer surfaces of the dielectric layers, wherein said electrodes provide an AC drive signal for thereby generating light within said phosphor layer, wherein at least a portion of the light is transmitted substantially laterally to said substrate surface through said side of said phosphor layer;
decoupling means operatively positioned adjacent to said phosphor layer for decoupling the portion of light being transmitted substantially laterally to being transmitted away from said substrate surface
wherein said de-coupling means includes a light reflective surface having a predetermined contour, and wherein said reflective surface extends across said phosphor layer thickness.

17. A light emitting apparatus comprising:
one or more thin film electroilluminescent devices, wherein each said device comprises:
a light generating active phosphor layer sandwiched between dielectric layers fabricated onto a planar substrate;
electrodes formed on the outer surfaces of the dielectric layers, wherein said electrodes provide an AC drive signal to said device, thereby causing a generation of light within said phosphor layer by electroilluminescence, at least a portion of the light being transmitted substantially laterally to said substrate;
a de-coupling means for de-coupling the laterally transmitted light away from the plane of the substrate;
wherein said de-coupling means comprises one or more associated reflective structures fabricated one of: in and onto the substrate;
an emitting aperture comprising an emitting facet formed in the phosphor layer such that the laterally transmitted light from said emitting facet is reflected by one of said associated reflective structures;
wherein said emitting aperture is filled or coated with at least one optically transparent material having a low coefficient of attenuation at one or more wavelengths of light emitted by the phosphor layer;
wherein the at least one optically transparent material has a refractive index at least equal to that of the phosphor layer so as to form an optical transmission region between the phosphor layer and at least one of the associated reflective structures.

18. A light emitting apparatus comprising:
one or more thin film electroilluminescent devices, wherein each said device comprises:
a light generating active phosphor layer sandwiched between dielectric layers fabricated onto a planar substrate;
electrodes formed on the outer surfaces of the dielectric layers, wherein said electrodes provide an AC drive signal to said device, thereby causing a generation of light within said phosphor layer by electroilluminescence, at least a portion of the light being transmitted substantially laterally to said substrate;
a de-coupling means for de-coupling the laterally transmitted light away from the plane of the substrate;
wherein said de-coupling means comprises one or more associated reflective structures fabricated one of: in and onto the substrate;
an emitting aperture comprising an emitting facet formed in the phosphor layer such that the laterally transmitted light from said emitting facet is reflected by one of said associated reflective structures;
wherein said emitting aperture is filled or coated with at least one optically transparent material having a low coefficient of attenuation at one or more wavelengths of light emitted by the phosphor layer;
a top surface of the emitting aperture is coated with an anti-reflection coating to enhance a transmission of light that has been reflected by the at least one of the associated reflective structures.

19. A light emitting apparatus comprising:
one or more thin film electroilluminescent devices, wherein each said device comprises:
a light generating active phosphor layer sandwiched between dielectric layers fabricated onto a planar substrate;
electrodes formed on the outer surfaces of the dielectric layers, wherein said electrodes provide an AC drive signal to said device, thereby causing a generation of light within said phosphor layer by electroilluminescence, at least a portion of the light being transmitted substantially laterally to said substrate;
a de-coupling means for de-coupling the laterally transmitted light away from the plane of the substrate;
wherein said de-coupling means comprises one or more associated reflective structures fabricated one of: in and onto the substrate;
an emitting aperture comprising an emitting facet formed in the phosphor layer such that the laterally transmitted light from said emitting facet is reflected by one of said associated reflective structures;

wherein said emitting aperture is filled or coated with at least one optically transparent material having a low coefficient of attenuation at one or more wavelengths of light emitted by the phosphor layer;

wherein for each of at least some of said devices, at least one of the associated reflective structures has two mutually inclined reflecting surfaces, and the at least one associated reflective structure is located between the emitting apertures of two active phosphor layers of two of said devices for thereby providing a single light source when the transmitted light is emitted from each emitting aperture of the two active phosphor layers.

20. A light emitting apparatus as claimed in claim 34, wherein each said device is individually addressed electrically for forming an array from said one or more devices such that said array provides a high resolution image bar.

* * * * *